(12) United States Patent
Orsbon et al.

(10) Patent No.: US 7,368,513 B2
(45) Date of Patent: May 6, 2008

(54) WATER-SOLUBLE ELECTRICALLY INSULATIVE COMPOSITION, MODIFICATIONS, AND APPLICATIONS THEREOF

(75) Inventors: Wyatt B. Orsbon, Sacramento, CA (US); Rex A. Hodge, Sacramento, CA (US); Rolf R. Becker, Orangevale, CA (US)

(73) Assignee: SemGreen, L.P., Houston, TX (US)

( * ) Notice: Subject to any disclaimer, the term of this patent is extended or adjusted under 35 U.S.C. 154(b) by 0 days.

(21) Appl. No.: 11/043,460

(22) Filed: Jan. 25, 2005
(Under 37 CFR 1.47)

(65) Prior Publication Data

US 2005/0133767 A1     Jun. 23, 2005

Related U.S. Application Data

(62) Division of application No. 10/143,198, filed on May 9, 2002, now Pat. No. 6,866,799.

(51) Int. Cl.
*C08F 283/00* (2006.01)

(52) U.S. Cl. ...................... 525/511; 525/514; 524/243; 524/272; 524/274

(58) Field of Classification Search ............... 252/511, 252/512, 514; 524/243, 272, 274; H01B 1/22, H01B 1/24
See application file for complete search history.

(56) References Cited

U.S. PATENT DOCUMENTS 5,855,820 A * 1/1999 Chan et al. ................ 252/511

\* cited by examiner

*Primary Examiner*—Robert D. Harlan
(74) *Attorney, Agent, or Firm*—Audrey A. Millemann; Weintraub Genshlea et al.

(57) ABSTRACT

The invention is an electrically insulative aqueous polymer composition. The composition includes a thermoplastic acrylic-styrene copolymer emulsion, a wetting agent, water, a surfactant, and a ductility agent. The invention also includes methods of using the electrically insulative composition, as well as methods of using a related electrically conductive aqueous polymeric vehicular emulsion composition.

13 Claims, 2 Drawing Sheets

WATER-SOLUBLE ELECTRICALLY INSULATIVE COMPOSITION, MODIFICATIONS, AND APPLICATIONS THEREOF

CROSS-REFERENCE TO RELATED APPLICATION

This application is a divisional of prior application Ser. No. 10/143,198 filed on May 9, 2002 now U.S. Pat. No. 6,866,799, pursuant to 35 U.S.C. §121, and hereby incorporates that application by reference.

I. BACKGROUND OF THE INVENTION

1. Field of Invention

The disclosed invention is an aqueous polymeric vehicular emulsion composition containing suspended electrically conductive material. The present invention is particularly relevant to the field of electronics and other electrical applications, such as printed circuit boards, EMI & RFI shielding and electrochemical fuel cell applications.

2. Description of Prior Art

The electronics industry and its peripheries annually spend substantial resources on manufacturing processes and materials. Many of these processes and materials are expensive and environmentally hazardous. For example, two fields of the electronics industry, circuit board etching and Electro-Magnetic Interference (EMI) shielding, regularly use expensive and toxic chemicals in product fabrication. A circuit board is produced using expensive caustic acids to etch away the photo-reactive metallic layer from the circuit board substrate. The by-products of this process are typically expensive to recycle or else non-recyclable and require costly disposal programs.

Another form of circuitry is the hybrid ceramic circuit utilized in specialized niche markets in electronics industries. Hybrid ceramic circuits are expensive, requiring extremely high constant temperatures to manufacture. They typically are utilized as miniature circuit boards employed as components on larger circuit boards wherein space is a critic factor. However, the high cost of manufacturing hybrid ceramic circuits is prohibitive to widespread commercial use.

EMI shielding is incorporated extensively in electronics. It is an integral part of computers, medical equipment and any other EMI sensitive electronics. Electromagnetic interference from the environment or from internal sources, such as high-speed circuits, can disrupt numerous electronics. Often, entire systems must be shielded in order to minimize EMI. Prior art methods of shielding electronics from EMI leave significant room for improvement. For example, the high-speed circuits are often simply isolated and removed as far as possible from the other, more sensitive electronics. Another method is to incorporate metal boxes onto the circuit boards themselves to directly shield the sensitive electronics. However, propinquity and the potential for material compatibility conflicts may be inappropriate or unacceptable for numerous applications. Yet, another method of producing EMI shielding utilizes Chemical Vapor Deposition (CVD) of copper onto the substrate to be shielded. This method of EMI shielding is expensive and creates environmentally hazardous by-products. A more effective method for manufacturing EMI shielded products utilizes electrically conductive polymers to coat the substrate that is to be shielded. However, the majority of these polymers use Volatile Organic Compounds (VOCs) as solvents to emulsify the polymer and electrically conductive material.

These harsh acids and VOC solvents are initially expensive to purchase. Their recycle or disposal is also expensive because they are environmentally hazardous. Likewise, they are also health hazards due to their generally toxic and/or flammable compositions. U.S. Pat. Nos. 5,492,653 and 5,658,499 are examples of prior art that posit the inclusion of water-miscible VOCs in water-based electrically conductive compositions to be employed in the electronics industry. However, VOCs commonly become trapped within solvent-based polymer compositions, including electrically conductive polymer compositions. The trapped solvents attack any metallic electrically conductive material and diminish or arrest its electrically conductive functionality, thereby compromising the efficacy of the electrically conductive composition as such. Moreover, the use of any VOCs is prohibited in industries, such as the Proton Exchange Membrane (PEM) fuel cell industry, wherein the components of the apparatus are extremely susceptible to corrosion caused by organic solvents.

In summation, it is manifest from prior art that an inexpensive, non-toxic alternative to these chemicals and processes would greatly improve several facets of the electronics industry. A less expensive electrically conductive multifunctional material would reduce production expenditures; a non-toxic alternative would mean less drastic and less expensive recycle and disposal programs. Such an alternative that is concurrently inexpensive and non-toxic would redouble the benefit to the electronics industry. Yet, heretofore no feasible alternative existed in the electronics industry.

The present invention embodies one such solution to the aforementioned problems of expensive and hazardous materials utilized in the electronics industry. The invention is relevant to the utility of water-based polymers—exclusive of water-miscible VOCs—as a vehicle for electrically conductive materials. This novel electrically conductive polymer can then be applied to an extensive number of substrates in order to impart electrical conductivity for numerous applications. This novel invention will reduce material expenditures and alleviate costly recycle and disposal programs.

There are industries, other than the electronics industry, that also would benefit from an electrically conductive water-based polymer technology. One such industry is the electrochemical fuel cell industry, especially the PEM fuel cell industry. PEM fuel cells constructions would benefit from electrically conductive sealants in order to seal the components in a fuel cell stack. Due to the novel and unobvious composition of the present invention, it is adept as an electrically conductive sealant within PEM fuel cells. Likewise, there are several other industries or markets that could utilize the present invention such as sensors, structural integrity sensor matrices, and electrical contacts.

II. SUMMARY OF THE INVENTION

The disclosed invention is an electrically conductive aqueous polymeric vehicular emulsion containing suspended electrically conductive material. The present invention is particularly relevant to electronics and other electrical applications, such as circuit boards, EMI shielding and structural integrity matrices. It is also relevant to the electrochemical fuel cell industry as a sealant. The fundamental object of the present invention is twofold: to embody an aqueous electrically conductive polymer that is environmentally benign and to reduce the costs associated with electronics production by incorporating less expensive materials that cost less to process. It is also a main object of this invention to be compositionally simple while multifunctional in application. The present invention is advantageous because it embodies a cost-effective and environmentally benign alternative to the expensive and hazardous etching acids and VOCs that are industry standards in electronics manufacturing. The present invention is also advantageous because of its multifunctional nature: it can be utilized in simple applications such as EMI shielding and as an electrically conductive PEM fuel cell sealant to complex applications such as circuit boards and structural integrity sensor matrices.

III. DESCRIPTION OF THE SEVERAL VIEWS OF THE DRAWINGS

The present invention will be elucidated with reference to the following disclosure in conjunction with the accompanying drawings in which.

IV. DETAILED DESCRIPTION OF THE PREFERRED EMBODIMENTS

Figure 1:
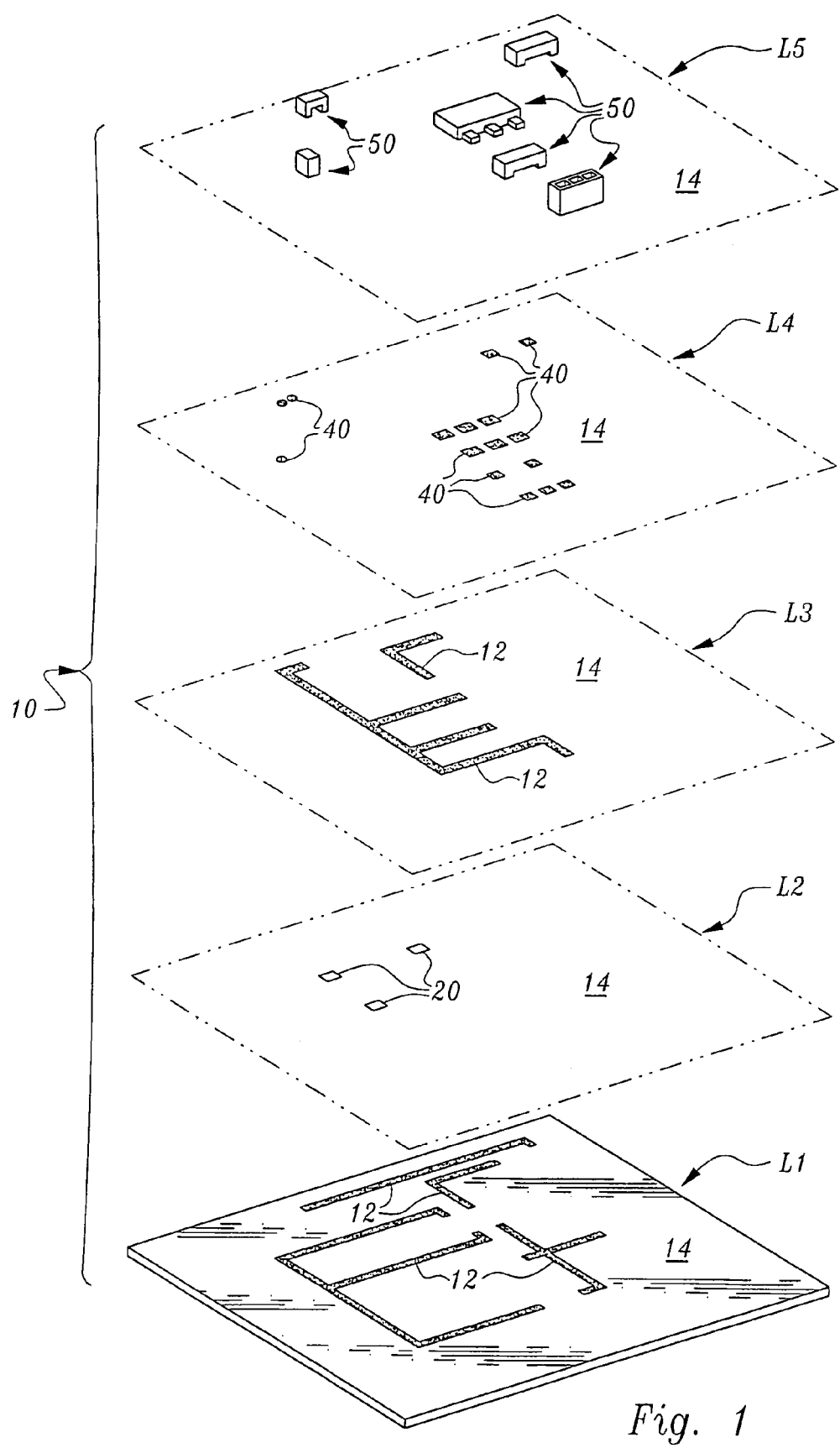
FIG. 1 is an exploded isometric view of a circuit board illustrating the principles of the multi-layered functionality of the present invention.

Within the spirit and scope the invention, an electrically conductive aqueous polymeric vehicular emulsion composition, there are numerous preferred embodiments. The delineated embodiments that follow are examples of the preferred embodiments of the invention; they are intended to represent the spirit and scope of the invention, but they do not encompass the exhaustive totality of the modifications or embodiments contained within the scope and spirit of the present invention.

A. Formula:

The disclosed invention is an electrically conductive aqueous polymeric vehicular emulsion composition containing suspended electrically conductive material. The formula for the inventive composition comprises some or all of the following components, depending on the application requirements for the composition which can be modified as described further below:

A first component (A) which is a gelling agent, such as a silicon dioxide composition containing silicon dioxide and trace amounts of hydrocarbons. Component (A) is included in a preferred range of approximately 1 to 8% of total compositional weight of the inventive composition in the various examples and modifications presented herein.

A second component (B) which is a thermoplastic polymer emulsion, such as an acrylic-styrene copolymer emulsion. Component (B) is included in a preferred range of approximately 8 to 45% of total compositional weight of the inventive composition in the various examples and modifications presented herein.

A third component (C) which is a wetting agent such as ethylene glycol n-butyl ether. Component (C) is included in a preferred range of approximately 1 to 42% of total compositional weight of the inventive composition in the various examples and modifications presented herein.

A fourth component (D) which is a dispersant, such as those related to carboxylic acid. Component (D) is included in a preferred range of approximately 0.1 to 5% of total compositional weight of the inventive composition in the various examples and modifications presented herein.

A fifth component (E) which is water. Component (E) is included as part of the electrically conductive aqueous polymeric composition in solvency effective amounts.

A sixth component (F) which is a silicone-based antifoaming emulsion. Component (F) is included in a preferred range of approximately 0.01 to 5% of total compositional weight of the inventive composition in the various examples and modifications presented herein.

A seventh component (G) which is a surfactant, such as an acrylate copolymer with trace amounts of 2-ethylhexyl acrylate and ethyl acrylate. Component (G) is included in a preferred range of approximately 0.1 to 5% of total compositional weight of the inventive composition in the various examples and modifications presented herein.

An eighth component (H) which is a bonding agent, such as an aminoalkyl-functional silane: gamma-aminopropyltriethoxysilane or $(CH_3CH_2O)_3SiCH_2CH_2CH_2NH_2$.) Component (H) is included in a preferred range of approximately 0.1 to 6% of total compositional weight of the inventive composition in the various examples and modifications presented herein.

A ninth component (I) is an aqueous silicone-based elastomer. Component (I) is included in a preferred range of approximately 0.1 to 7% of total compositional weight of the inventive composition in the various examples and modifications presented herein.

A tenth component (J) is an electrically conductive material, such as silver flake. Component (J) is included in a preferred range of approximately 1 to 50 microns in diameter in the various examples and modifications presented herein.

An eleventh component (L) which is a fluoro-polymer, such as polytetrafluoroethylene (PTFE) and/or perfluorosulfonic acid (PFSA) ionomer. Component (L) is included in a preferred range of approximately 0.1 to 19% of total compositional weight of the electrically conductive or electrically insulative formula. This component is for specific applications that require the polymeric properties that these two components manifest, such as electrochemical fuel cell applications.

B. Function of Formula Components:

The formula components in the present invention perform the following functions:

The first component (A) is a silicon dioxide composition containing 99.8% silicon dioxide and trace amounts of hydrocarbons. An exemplary component (A) is available from Degussa Corporation as product number R812S, a member of their Aerosil™ line of products. The hydrocarbons impart a hydrophobic quality to the silicone dioxide. This component is a gelling agent that forms silanol groups on the particle surfaces and these interact with each other via hydrogen bonds. A three dimensional network is formed which affects the rheology of the polymer composition. When a high shearing velocity is imposed on the material, this network is broken and the composition behaves in a Newtonian manner. In this state, it will move and separate from itself easily. With a lower shear rate, such as when the material is at rest or experiences low levels of agitation the polymer composition exhibits thixotropic behavior. These properties are very useful for adapting the polymeric composition to various printing and spraying processes. Some printing processes require a comparatively watery behavior while others require a more viscous consistency. By varying the amount of this component from the baseline values, it is possible to produce differentiated degrees of viscosity. Furthermore, this dual nature of Newtonian fluid and thixotropic behavior contributes to the overall applicability of the present polymeric invention. For example, in the case of spray gun applications, the high velocity achieved during dispersion allows the material to behave like a Newtonian fluid, which results in an even, light coating. At rest on the substrate, the material behaves like a gel. Component (A) can also be used as a suspension and thickening agent, facilitating the suspension of the electrically conductive material. Furthermore, this component increases the effectiveness of the defoamant and wetting agent. It also aids in corrosion resistance for the electrically conductive material. This component can be substituted effectively with other similar gelling agents such as thixotropiem, Gum Arabic and Xanthan Gum.

The second component (B) is a thermoplastic acrylic-styrene copolymer emulsion. An exemplary component (B) is available from BF Goodrich Corporation as Carboset™ CR-763. It is incorporated into the present invention because it forms a durable surface. When cured, it has excellent resistance to water vapor, mild VOC's and other chemicals that interact with the material surfaces or bond-interfaces with the substrate. The emulsion has a specific gravity of 1.03. With its density so close to that of water, solids will settle without problem. The disclosed invention is capable of being incorporated into fuel cells as a sealant due to the thermoplastic properties of the acrylic-styrene emulsion component that allows the material to be conformable within the fuel cell construction. This component can be substituted effectively with other similar thermoplastic polymer emulsions such as emulsions wherein the acrylic polymer is copolymerized with another polymer selected from the group including styrene polymers, acrylate polymers, polyacrylate polymers, (meth)acrylate polymers, poly(meth)acrylate polymers, hydroxyl polymers; esters and acids of acrylic polymers, styrene polymers, acrylate polymers, polyacrylate polymers, (meth)acrylate polymers, poly(meth)acrylate polymers, hydroxyl polymers and further polymerizations thereof.

The third component (C) is a wetting agent such as ethylene glycol n-butyl ether. This component can be procured from a number of sources, one exemplary source being the trade name product Butyl Cellusolve™. This component helps keep the other various components in solution during mixing and aids in the formation of the proper structure during the curing process. This function helps keep the electrically conductive material evenly dispersed throughout the composition, which aids in the overall electrical conduction of the composition. The electrical resistance through the polymer composition is therefore low. This component also provides corrosion protection. This component can be substituted effectively with other similar wetting agents including methyl diglycol, butyl diglycol ether, propylene glycol methyl ether, dipropylene glycol methyl ether, ethylene glycol n-butyl ether and diethylene glycol n-butyl ether.

The fourth component (D) is a dispersant. It is 75% water and 25% sodium salt of polymeric carboxylic acid. An exemplary component (D) is available from the Rohm and Hass Company as the product Tamol 731A. This component aids in the wetting and dispersion of electrically conductive material and other components into the overall polymeric composition. This component can be substituted effectively with other similar dispersants including carboxylic resin polymers, carboxylic acid resin polymers, salts of carboxylic resin polymers, salts of carboxylic acid resin polymers, soja-lecithin, and alkyl phenol polyglycol ether.

The fifth component (E) is water. Deionized water is preferred. The water is used to wet and solvate the compositional material to aid in mixing and suspension. It also suppresses certain chemical and physical reactions that can cause the polymeric composition to "curdle" or mix improperly.

The sixth component (F) is a silicone-based antifoaming emulsion. An exemplary component (F) is available as Dow Corning Additive 62. This component is necessary to make the material compatible with high speed mixing; otherwise, a foaming condition would inhibit the wetting and the general cohesion of the composition. The silicone penetrates the bubbles and causes them to collapse. As a corollary, the antifoaming action also allows the material to be utilized in aggressive printing procedures. This additive also aids in protection against corrosion and oxidation. This component can be substituted effectively with other similar silicone-based emulsion antifoaming agents.

The seventh component (G) is a surfactant. An exemplary component (G) is available from Monsanto as the product Modaflow™ AQ-3000. This acrylate copolymer has trace amounts of 2-ethylhexyl acrylate and ethyl acrylate and is incorporated as a surfactant and as a flow agent that enhances rheological properties. This copolymer also has the effect of aiding in the integration of metal material into the solution. If needed, by augmenting the amount of this additive in the composition, increased amounts of metal flake can be incorporated, which can result in higher conductivity. This component can be substituted effectively with other similar surfactants including acrylate resin polymers, ethyl resin polymers, ethylhexyl resin polymers, cross-linked acrylate-ethyl resin polymers, cross-linked acrylate-ethylhexyl resin polymers, hydroxy propyl methyl cellulose and hydroxy ethyl methyl cellulose.

The eighth component (H) is a bonding agent. An exemplary component (H) is available as Dow Corning product number Z-6011. This substance is an aminoalkyl-functional silane: gamma-aminopropyltriethoxysilane or $(CH_3CH_2O)_3SiCH_2CH_2CH_2NH_2$. This substance is typically incorporated with thermoset resins to increase the physical bonding of glass fiber. However, in this case the bonding agent is employed to augment the bonds between the metal material and the polymeric solution, and the polymer solution and the substrate. Thus, more of this component can be added if a higher metal loading is required or if the substrate is especially smooth. This component can be substituted effectively with other similar bonding agents including silanes, aminoalkyl silanes, alkyl silanes, amino silanes, acrylates and polyacrylates.

The ninth component (I) is an aqueous silicone-based elastomer. An exemplary component (I) is available as Dow Corning Additive 85. This component serves several functions: it improves the elongation and durability of the composition; it also adds ductility and flexibility without interfering with the electrical conduction. The aqueous silicone elastomer also provides corrosion protection. In addition, it also increases adhesion on acrylics and silanes, which is particularly useful in producing multi-layered circuit boards with the novel electrically conductive aqueous polymer invention. This component can be substituted effectively with other similar elastomers including silicone-based elastomers, silicone polysiloxane, paraffins, alkaline paraffins, macro-paraffins and calcium stearate.

The tenth component (J) is an electrically conductive material such as silver flake. An exemplary component (J) is available from Atlantic Equipment Engineers as AG-110 silver metal flake. It is imperative to use pure electrically conductive material that is free from any coating, oxidation or contaminates. When using metallic materials such as silver flake it should be approximately 1 to 50 microns in diameter for most applications. Silver flake is the preferred electrically conductive material for the polymeric vehicle, but substantial formula modifications can be implemented for specific purposes. This component can be substituted effectively with other electrically electrically conductive materials including aluminum, antimony, bismuth, cadmium, chromium, copper, gallium, gold, iridium, lead, magnesium, manganese, mercury, molybdenum, nickel, palladium, platinum, rhodium, selenium, silver, tantalum, tellurium, tin, titanium, tungsten, uranium, zinc, zirconium, silver halide, electrically conductive carbons, carbon nanostructures, carbon blacks, graphites, and mixtures thereof.

Furthermore, both the electrically conductive and electrically insulative formula for the present invention can be augmented with fluoro-polymers, such as polytetrafluoroethylene (PTFE) and/or perfluorosulfonic acid (PFSA) ionomer, for specific applications that require the properties that these two components manifest, such as electrochemical fuel cell applications. This additional Component (L) is included in a preferred range of 0.1 to 19% of total compositional weight of the electrically conductive or electrically insulative formula. Exemplary Component (L)'s are available from Dupont as Teflon® (PTFE) and Nafion® (PFSA).

C. Example of Electrically Conductive Aqueous Polymeric Vehicular Emulsion Composition Embodiment:

The following is an example of an operative embodiment of the aqueous polymeric vehicular emulsion composition:

EXAMPLE i. A first component stage containing substantially: (A) 2.4% of a gelling agent which comprises 96-97% silicon dioxide and 3% to 4% hydrocarbons, such as $CH_3$; (B) 23.3% of a thermoplastic acrylic-styrene copolymer emulsion; (C) 13.9% of a wetting agent, such as ethylene glycol n-butyl ether; (D) 0.31% of a dispersant which comprises 75% water and the balance being a sodium salt of polymeric carboxylic acid; (E) and 2.32% of deionized water, ii. A second component stage containing substantially: (F) 0.04% of a silicone-based antifoaming emulsion; (G) 0.39% of a surfactant, such as an acrylate copolymer with traces of 2-ethylhexyl acrylate and ethyl acrylate; (E) and 0.77% of deionized water, iii. A third component stage containing substantially: (H) 0.27% of a bonding agent, such as an aminoalkyl-functional silane; (E) and 0.77% of deionized water, iv. A fourth component stage containing substantially: (I) 0.58% of a water based elastomer, such as a silicone-based elastomer; (E) and 1.55% of deionized water, and v. A fifth component stage containing substantially: (J) 53.4% of silver flake of 1 to 50 microns in diameter.

The above example represents a baseline electrically conductive aqueous polymeric vehicular emulsion composition. Raising or reducing the relative concentrations of different components within the ranges previously specified herein will result in the various modifications to the inventive composition discussed below.

Further, with regard to the example, there are five component stages specified. With regard to each stage, it is necessary to add each stage in the order specified. To add component stages to the mix in some other order may result in a falling out of some of the materials or an incorrect pH, which will disrupt the other chemical components when they are added. Stages with multiple components such as stages one, two, three and four require premixing. Stage five need not be premixed.

Each stage is separately premixed using a high speed rotary batch mixer or a similar device. A similar batch mixer is used to mix all the stages together, once premixing is complete. Stages including chemical component (A) will become thicker with additional mixing work even at the same chemical concentrations. Very thick versions can thus be made with a roller mill. Stage two material is then added to the stage one material gradually, while the stage one material is in the mixer. Each subsequent stage is added in the same manner with sufficient mixing before the addition of the next stage. Optimal mixing temperatures are between 15 and 25 degrees C. The optimum pH for the finished electrically conductive inventive composition composition is in a range of 6 to 8.

D. Specific Formula Modifications:

Within the spirit and scope of the invention, there are numerous specific formula modifications, as well as others that can be extrapolated from examining the disclosure.

The delineated modifications that follow are examples of preferred embodiments of the invention: they are intended to represent the spirit and scope of the invention, but they do not encompass the exhaustive totality of modifications or embodiments contained within the broad scope and spirit of the present invention.

i. Electrically Insulative Formula:

The first formulaic modification is a corollary composition to the electrically conductive polymer disclosed above. This modification is a nonconductive or otherwise electrically insulative formulation. It is intended to be interposed between electrically conductive layers; to protect the surface of the applied material; or, to insulate an electrically conductive substrate from the electrically conductive material that is to be applied successively. This aqueous electrically insulative polymer composition is prepared in a stage-process analogous to that of the aqueous electrically conductive polymer composition disclosed above. The electrically insulative formula comprises some or all of components B, C, E, G, K, and L in the following preferred ranges of total compositional weights:

Component (B) which is included in a preferred range of approximately 50 to 91% of total compositional weight of the electrically insulative formula in the various examples and modifications presented herein.

Component (C) which is included in a preferred range of approximately 1 to 33% of total compositional weight of the electrically insulative formula in the various examples and modifications presented herein.

Component (G) which is included in a preferred range of approximately 0.1 to 7% of total compositional weight of the electrically insulative formula in the various examples and modifications presented herein.

Component (K) which is included in a preferred range of approximately 0.1 to 8% of total compositional weight of the electrically insulative formula in the various examples and modifications presented herein.

Component (L) which is included in a preferred range of approximately 0.1 to 19% of total compositional weight of the electrically insulative formula in the various examples and modifications presented herein.

The only electrically insulative formula component that is not also contained in the electrically conductive polymeric composition is (K) Dibutyl Phthalate. This component is available from Chemcentral, Inc. of Chicago, Ill., among other vendors. This additive increases ductility and thus enables the use of the electrically insulative polymeric composition with substrates that are flexible. Dibutyl Phthalate also prevents cracking caused by harsh mechanical, chemical or other environmental stimuli. As a result, the electrically insulative polymeric emulsion composition is a tougher, more durable product after curing. This component can be substituted effectively with other ductility agents including butyl phthalate, for example.

Because this electrically insulative material shares basic compositional similarities with the electrically conductive polymer composition disclosed above, these two related materials react to environmental, chemical and mechanical stimuli in a similar manner, thus maximizing compatibility and part-life in the widest variety of operating conditions.

ii. Example of Electrically Insulative Aqueous Polymeric Emulsion Composition Embodiment:

The following is an example of an operative embodiment of the electrically insulative aqueous polymer composition:

EXAMPLE i. A first component stage containing substantially: (B) 82% of a thermoplastic acrylic-styrene copolymer emulsion, ii. A second component stage containing substantially: (C) 10.7% of a wetting agent, such as ethylene glycol n-butyl ether; (K) 0.46% of a ductility agent such as dibutyl phthalate; and (E) 1.94% of deionized water, iii. A third component stage containing substantially: (G) 0.34% of a surfactant, such as an acrylate copolymer with traces of 2-ethylhexyl acrylate and ethyl acrylate; and (E) 4.56% of deionized water.

The electrically insulative composition is comprised of component stages, similar to the electrically conductive inventive composition. The electrically insulative composition stages must be introduced in the order shown. All three stages must be premixed. Optimal mixing temperatures are between 15 and 25 degrees C. The optimum pH for the finished electrically insulative composition is in a range of 6 to 8.

iii. Conductivity Modifications:

Another type of formula modification of the disclosed invention can evolve from conductivity requirements. It may be necessary to increase the conductivity for a particular function; likewise, it may also be necessary to reduce the conductivity of the composition for a specific application. Manipulating the percentage of the electrically conductive material in the formula will modify the conductivity of the composition. One such modification should be particularly noted: aluminum, antimony, bismuth, cadmium, chromium, copper, gallium, gold, iridium, lead, magnesium, manganese, mercury, molybdenum, nickel, palladium, platinum, rhodium, selenium, silver, tantalum, tellurium, tin, titanium, tungsten, uranium, zinc, zirconium, silver halide, electrically conductive carbons, carbon nano-structures, carbon blacks, graphites, and mixtures thereof can be substituted for the silver flake in the composition, producing numerous alternative compositional embodiments with varying electrical resistance. Said embodiments can be employed as a printable continuous resistor in electrical circuitry, for instance. The electrical resistance can be set accurately by controlling the concentrations of the various electrically conductive materials incorporated into the composition. In addition, the electrical resistance can be modified according to the width, length and thickness of the printed resistor. The resistivity is inversely proportional to the width and thickness of the resistor; it is directly proportional to the length of the resistor.

As stated above, it may also be necessary to increase the conductivity for a specific application, such as circuit board printing, for example. The conductivity can be increased by augmenting the silver content in the composition. However, it will also be necessary to increase the amount of the gelling agent, which facilitates the suspension of increased amounts of electrically conductive material and/or increasing the amount of the surfactant to facilitate more electrically conductive material integration. Increasing the amount of the gelling agent allows for higher concentrations of silver to be suspended in the composition, thus increasing conductivity. In addition, the aminoalkyl-functional silane bonding agent can also be augmented in order to enhance the bonds between the polymeric composition and the electrically conductive material.

iv. Sealant Modifications:

Another set of preferred embodiments stem from the sealing requirements dictated by specific applications, such as sealing PEM fuel cell separators. For example, if the substrate is a fuel cell separator, made of graphite, then the sealing agent can be augmented in order to maintain integration strength with the porous substrate. Likewise, if the substrate is leiodermatous, salebrous, porous, distressed or flexible, then the composition can be modified in order to maintain satisfactory integration. When this type of compositional modification is necessary, the aminoalkyl-functional silane bonding agent can be augmented in order to improve the mechanical properties and integration between the polymeric composition and the substrate. This agent also increases adhesion with porous, salebrous and leiodermatous substrates.

In some applications, it may also be necessary to increase the amount of the silicone-based elastomer. The elastomer provides additional compositional ductility, which will be necessary for those applications with flexible and distressed substrates. The elastomer also increases adhesion on acrylics and silanes, which is useful in circuit board fabrications. In those applications in which distressed or flexible substrates are used, or in which the operating conditions are severe, it may be necessary to implement the use of dibutyl phthalate. The dibutyl phthalate also increases the overall compositional ductility, but it also improves the mechanical properties of the material and thus contributes to a more durable product.

v. Corrosion and Mechanical Stress Modifications:

It is probable that certain applications for the disclosed polymeric composition will require extraordinary corrosion protection from the severity of their operational environment, such as structural integrity matrices and electrochemical fuel cells, for example. Some operating environments can be chemically hazardous and/or mechanically stressful for the material composition. The problem of mechanical stress brought on by environmental stimuli can be addressed with similar solutions to those found above with adhesion modifications: increasing the amount of the elastomer and/or dibutyl phthalate. These two additives improve the ductility and flexibility of the novel composition. By increasing the flexibility and ductility of the composition, it is possible to arrest the accumulation of the stress fractures and the delamenation of the material from the substrate.

The presence of delamenation and fractures contributes significantly to the corrosive chemicals penetrating the material and compromising the integrity of the composition. Therefore, the alleviation of the delamenation and stress fractures will provide some corrosion protection. However, it will also be necessary to modify those polymeric composition components that directly effect the corrosion protection of the material itself. One such modification will be to increase the amount of the silicon-based components in the composition, such as the silicon dioxide component. This additive contains substantially pure silicon dioxide with trace amounts of hydrocarbons. The hydrocarbons impart a hydrophobic quality to the silicon dioxide that bonds with the silver particles. Since silver oxidizes quickly, it is imperative to protect it from water and other chemical sources of oxidation. Likewise, the silicone-based antifoaming agent can also be augmented; it also contributes to corrosion protection by enveloping the silver particles. Another silicone-based component that can be manipulated is the elastomer. The elastomer protects the metal from oxidation and it improves the cohesion of the polymeric composition as a whole.

vi. Viscosity Modifications:

Both the electrically conductive and the electrically insulative polymeric compositions are capable of being applied to substrates in numerous manners, for example: hand brushing, spraying, screen printing, tampon printing, stenciling, gravure printing and embossed printing. Each of these operations requires different material parameters for satisfactory application of the composition. One such material parameter is viscosity. For instance, some printing processes require higher viscosity in order to transfer the material from the printing tool to the printable substrate. The material viscosity is directly related to the material surface tension. The material surface tension is the physical parameter that dictates the ability to transfer the material from the printing tool to the printable substrate. For example, if either the electrically conductive or the electrically insulative composition is applied to a substrate via tampon printing, then the formula may need to be modified in order to increase the viscosity in order to maintain reasonable surface tension to provide sufficient release from the cliche to the tampon, and then from the tampon to the substrate. In order to increase the viscosity of the composition the amount of the silicon dioxide gelling agent can be increased; or, the overall percentage of water in the composition can be decreased as long as effective solvency is maintained. The same is also true for screen printing, stencil printing and gravure printing, in which the material needs to be more viscous in order to achieve satisfactory release and maintain even coverage.

In the case of pen plotter printing, ink jet printing masked printing or the use of a spraying apparatus, the viscosity of the material may need to be decreased so that the material will flow at a reasonable rate. The formulaic modifications will be the opposite of the example above: the percentage of the gelling agent can be reduced; or the percentage of water in the composition can be increased.

vii. Drying Modifications:

Both the disclosed electrically conductive and the electrically insulative polymeric compositions are capable of being applied to numerous substrates utilizing, but not limited to, the printing methods enumerated below. Each of these printing processes may require manipulating the formula in order to achieve preferred drying or curing conditions. For example, the drying conditions can be influenced by manipulating the percentage of the gelling agent. However, optimum drying conditions are dictated by the environment of the drying system. Drying environment parameters such as air flow, temperature and humidity can be manipulated in order to optimize drying in the manufacturing process. It is useful to be able to control these drying parameters because some production operations require fast drying, such as stenciling; while some production operations require slower drying, such as printed circuit boards that may require several component placement operations during a single production cycle.

E. Printed Circuit Boards:

The disclosed invention is an electrically conductive aqueous polymeric emulsion composition. It was specifically designed to be a low-cost, multifunctional, water-based electrically conductive polymer to be utilized by such industries as the electronics industry, its peripheries and fuel cell technologies. The advantages of utilizing this polymeric invention as a circuit board technology are manifold: circuit board assemblies that incorporate it are capable of more flexibility, a three dimensional layout, lighter weight, lower profile and lower cost.

The versatility of the present invention allows it to be applied to numerous circuit board substrates, such as: plastics, organic materials, stone, concrete, glass, crystalline materials, clothes, leathers, foams, and metals. The prior art circuit board technologies have been limited to a select number of compatible substrates. Rigid Printed Circuit Boards (PCBs) are typically copper-clad phenolic, which is flat, rigid and expensive. Traditional flexible circuit boards are usually made from expensive flexible plastics that can survive soldering temperatures. Most importantly, the traditional substrates are additional components in the device itself. With the advent of the present invention, it is possible to print the electrically conductive polymeric material directly onto the structure of the device itself: in effect, eliminating a whole set of electronics components. Rather than printing the circuit board on an additional component, which compounds material and assembly costs, printing the circuit board directly onto the essential material that inherently forms the product itself diminishes production and assembly costs. This method of circuit board printing is referred to as Essential Material Electronics (EME). The EME concept of printing the circuit directly onto the shell of the product can be developed further than those applications concerning injection-molded plastics for electronic devices. Likewise, EME printing reduces manufacturing costs as well as material costs because there is no superfluous "board" on which to assemble. Using the present polymeric invention, it is possible to print a complex circuit onto most plastics, organic materials, stone, concrete, glass, crystalline materials, clothes, leathers, foams, and metals. In order to print a circuit board onto an electrically conductive substrate, such as metals or graphite, it is merely necessary to first apply a layer of the electrically insulative polymeric composition. The electrically conductive polymeric composition can then be applied in the circuit pattern.

It is within the scope and spirit of the disclosed aqueous electrically conductive polymeric composition to print multiple circuits onto a single substrate by interposing layers of the electrically insulative polymeric composition between the electrically conductive layers. This creates a Multiple Layer Circuit (MLC). This printable feature of the disclosed electrically conductive polymeric composition allows a single substrate to facilitate multiple circuits while reducing space and production costs for the circuit board. With some design complexity, it is possible to interweave these aforementioned circuit patterns for specific purposes; for example, so that desired electromagnetic fields (EMFs) are produced or received, for example. As a corollary to interposing electrically insulative layers betwixt electrically conductive layers, the electrically insulative formulaic material can be topically applied to provide durability and scratch resistance to the surface of the part.

In order to illustrate an example, the circuit board 10 shown in FIG. 1 is embodied as a multiple layer circuit comprised of layers L1-L5. The electrically conductive traces 12, insulator points 20 and mounting pads 40 can be applied utilizing manifold printing methods, such as: stencil or screen printing, transfer pad or tampon printing, pen plotter printing, ink jet printing, masked printing, waterless lithography printing, and flexographic printing. These methods are discussed further, below.

Figure 2:
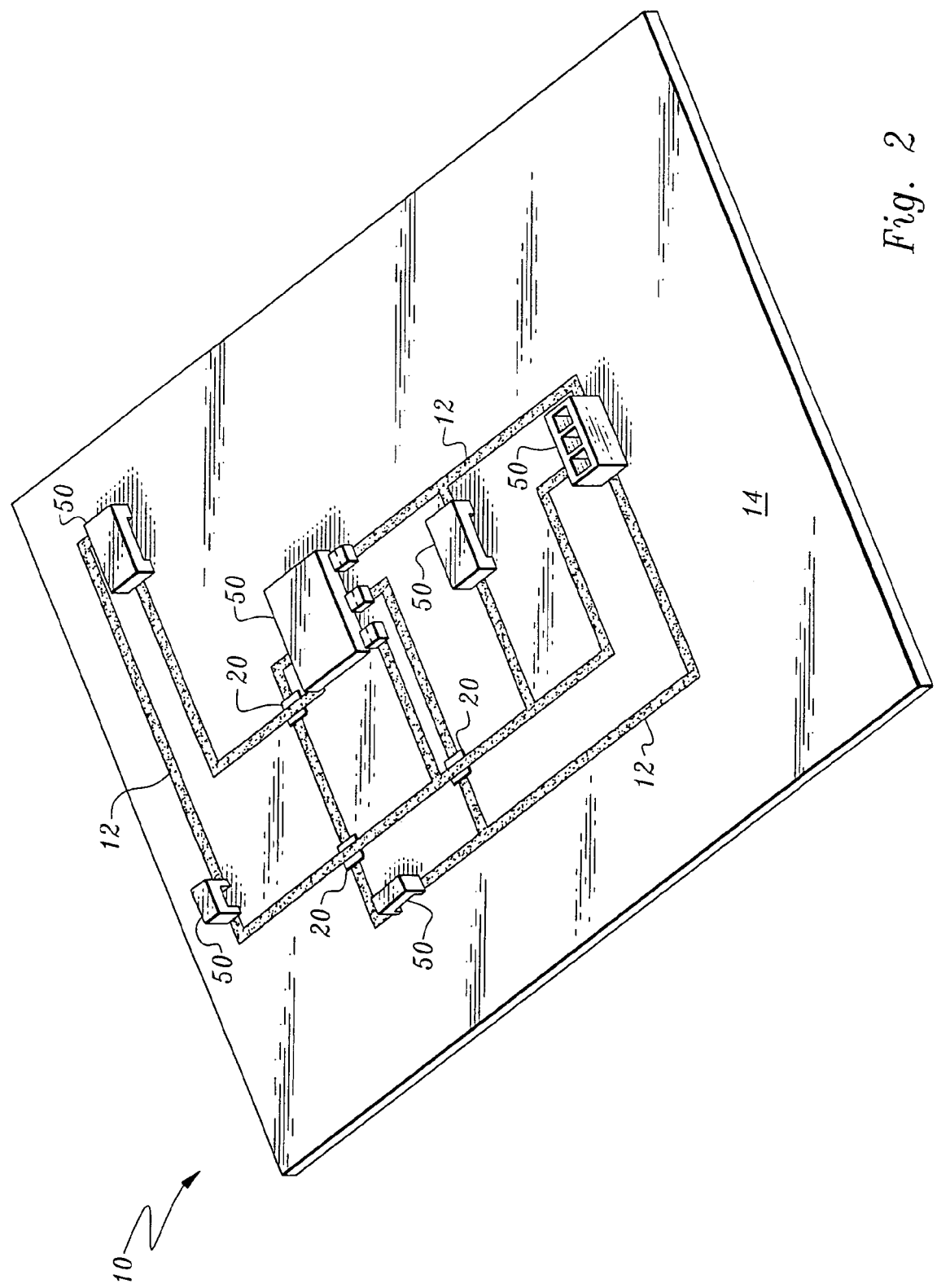
FIG. 2 is an isometric view of the integrated multi-layered circuit board embodying the present invention.

The first layer of the present invention, denoted "L1", is comprised of the first electrically conductive traces 12 applied to the substrate 14. Each of the remaining layers L2-L5 are likewise eventually applied to substrate 14 during manufacturing. In FIG. 1, layers L2-L5 are shown as imaginary planes with numbered components associated with each layer. Layers L2-L5, give the components positionings in space, relative to the components of other layers, and relative to the substrate 14 to which they will eventually be applied. FIG. 2 shows this eventual application of all the layers L1-L5 upon substrate 14 to form a printed circuit board 10. On L1, traces 12 are comprised of the electrically conductive polymer. The present invention is compatible with numerous substrates: three-dimensional, extremely smooth, extremely rough, porous, distressed, electrically conductive or flexible, etc. However, in the case of fabricating circuit boards 10 using the inventive electrically conductive polymer, the substrate must be compatible with the intended components, i.e., the substrate cannot be three-dimensional, flexible, etc., if the respective components are not comparably three-dimensional, flexible, etc. In the case of the layered circuit board embodiment 10 exemplified in FIGS. 1 and 2, the substrate 14 is dimensionally stable and non-conductive. If the substrate 14 is electrically conductive, it also may be necessary for the substrate to be coated with a thin yet effective layer (not shown) of the electrically insulative formula of the present invention.

As noted previously, L1 contains the first electrically conductive traces 12 of the circuit. It is useful for printed circuits to be embodied in multiple layers L1-L5 in order to connect various points of the circuit without short-circuiting other traces 12 connecting other points of the circuit. Thus, electrical contact between multiple layers should occur only where desired. The configuration of traces 12 of L1 is designated as such in order to obviate the potential "overlapping" of traces in a two-dimensional, one layer circuit. By embodying the circuit board 10 in three dimensions, the circuit design can be simplified logistically. As a corollary, the circuit board 10 can be made more complex because of the added dimension in which to embody the circuitry.

The second layer, "L2", is a layer embodying a selectively printed insulator at points 20 comprised of the electrically insulative formula of the present invention. The electrically insulative composition is applied to L2 at specific points 20 of intersection of the electrically conductive traces 12 of L1 and the electrically conductive traces 12 of "L3" in order to interpose and insulate the points 20 of convergence of these two trace configurations that would otherwise short out the circuit board or disrupt operation.

"L3" is the third layer of the embodied circuit board 10; it comprises the remainder of the electrically conductive traces 12 necessary to complete the electrical circuit of the circuit board 10 minus the Surface Mount Technology (SMT) components 50. The electrically conductive traces of L3 are spatially coordinated with the electrically conductive trace of L1 and the insulators of L2 in order that the trace configurations conjoin adequately and allow properly electrical conduction.

The fourth layer of the exemplified circuit board 10, denoted as "L4", embodies the electrically conductive mounting pads 40, utilized for the mounting and fastening of the SMT components 50 to the circuit board 10. The mounting pads 40 comprise the electrically conductive formula of the present invention in order to connect the SMT components 50, such as resistors, capacitors, diodes, timers, processors, etc., to the circuitry of the circuit board 10. The mounting pads 40 illustrated here are examples of the preferred embodiments of the present invention in which the viscosity is manipulated in order to render the composition more gel-like. When the viscosity is augmented and the composition is more gelatinous, the SMT components adhere more securely to the mounting pads, ensuring sufficient electrical contact.

"L5" is the fifth layer of the multi-layered circuit board 10; it comprises the necessary SMT components 50 for the given circuit board being fabricated. The SMT components 50 are mounted into the electrically conductive mounting pads 40 of L4, thereby integrating them into the circuit board 10.

A possible sixth layer, not shown here, can be employed in such embodiments of the present invention; specifically, an electrically insulative and protective layer of the electrically insulative formula of the present invention. Such layers can be utilized to insulate the circuit board from other circuits or other potential electrical hazards; it can also protect the circuit board from environmental hazards such as corrosive chemicals, mechanical stress, etc. As a corollary, this protective layer can also be employed as the substrate for the fabrication of another circuit board.

FIG. 2 demonstrates the aggregated functions of the components of each layer in the circuit board embodiment. The trace configuration layers L1 and L3 are conjoined where necessary and insulated where necessary; the insulator points of L2 permit proper circuit board functionality without short circuits or disruptions; and the mounting pads of L4 secure the SMT components 50 of L5.

It is also within the scope and spirit of the disclosed aqueous electrically conductive polymeric composition to embody the printable resistors mentioned above in the section pertaining to formulaic modifications and embodiments. The resistance of a resistor is a function of the width, length and thickness of the circuit trace; it is also a function of the conductivity and concentration of the electrically conductive material comprising the resistor. Therefore, by modifying these variables, it is possible to achieve an extensive range of electrical resistance within a given resistor. The resistor can be printed continuously with the rest of the circuit, so that there are no discrete breaks in the pattern that may cause problems. The electrically conductive material comprises: aluminum, antimony, bismuth, cadmium, chromium, copper, gallium, gold, iridium, lead, magnesium, manganese, mercury, molybdenum, nickel, palladium, platinum, rhodium, selenium, silver, tantalum, tellurium, tin, titanium, tungsten, uranium, zinc, zirconium, silver halide, electrically conductive carbons, carbon nano-structures, carbon blacks, graphites, and mixtures thereof. Printed resistors reduce component cost in circuit board assembly by reducing the number of components needed.

Several printing methods are capable of printing satisfactory circuits in a viable, cost-effective manner. These printing methods include, but are not limited to, stencil and screen printing, transfer pad printing, dip printing, pen plotter printing, ink jet printing, masked printing, waterless lithography and flexographic printing. The extensive range of printing method options allows for process optimization by choosing the printing method that best fulfills the product requirements. There are numerous variables that make each printing method unique, such as: print resolution, adaptability for high-volume production, substrate compatibility, product geometry and circuit geometry. These printing variables dictate which manufacturing methods are optimal for each product substrate.

F. Manufacturing Methods:

Several manufacturing methods and physical embodiments of the disclosed invention are illustrated below:

i. Stencil & Screen Printing:

There are two basic stencil and screen printing press designs: the flatbed and cylinder designs. The traditional flatbed design places the substrate onto a flat bed or table. The frame and screen, which holds the circuit pattern, is situated over the substrate and remains stationary while an ink applicator, containing the present electrically conductive polymeric composition, passes across the print area on the screen. The combination of downward force and the horizontal motion of the ink applicator cause momentary contact of the screen with the substrate, resulting in the transfer of the circuit pattern.

The cylinder press design is more adept for flexible substrates, like cloth, thin plastics, some organic materials and metal foils. The cylinder press carries the substrate over a vacuum cylinder in a forward motion. The frame and screen, which holds the circuit pattern, move synchronous with the substrate, which is being moved by the rotating cylinder. The ink applicator, which contains the disclosed electrically conductive polymeric composition, remains stationary over the vacuum cylinder, in contact with the substrate. The curvature of the substrate, as it conforms to the contour of the cylinder, produces a sharper, cleaner image than the flatbed printing process.

Screen-printing is useful for numerous printing applications. However, manufacturers prefer not to screen print circuit boards if the conductor widths and spacings are less than approximately 0.3 mm. Furthermore, if these conductor lines run closely parallel for long distances, there is a risk that the tracks may merge. If these concerns arise, another printing technique should be used with the present electrically conductive polymeric composition.

The disclosed aqueous electrically conductive polymeric composition is compatible with the screen-printing method. Screen-printing, in general, prefers a more viscous, gel-like material. This preference can be easily accommodated with the formulaic modification delineated above as the "viscosity modification." As it is known by those competent in the relevant arts, the viscosity can indirectly influence drying parameters, such as drying time, air flow and temperature requirements. Therefore, the printing methods that prefer higher material viscosities, like screen-printing, will require longer drying times. However, the optimum drying conditions can be achieved by controlling the drying environment, rather than the formula. Manipulating the air flow, humidity and temperature within the drying environment, is preferable for production operations because it allows for the formula to remain within the material tolerances of the chemical components.

ii. Transfer Pad Printing:

Transfer Pad Printing (TPP), or Tampon Printing, is an indirect gravure printing process. The most important element in transfer pad printing is the transfer pad or tampon, usually made of silicon rubber. The silicon pad picks up the electrically conductive polymeric composition from the cliché, which is the photographically etched printing surface. The cliché holds the electrically conductive polymer "ink" in the image of the circuit to be printed. The silicon pad transfers the ink pattern from the cliché to the substrate. There are three variations as to this specific step in the transfer pad printing process: sealed ink cup, open inkwell and rotary gravure pad printing.

Transfer pad printing is the most versatile and flexible printing method; it is capable of printing on three-dimensional substrates; printing multiple colors; and printing wet-on-wet. TPP is the preferred printing method for substrates with complex surface geometries, although it can also be used with flexible and rigid substrates. It is compatible with metals and plastics, organic materials, stone and crystalline materials. TPP is economic as a high volume production method.

The disclosed aqueous electrically conductive and electrically insulative polymeric compositions are extremely compatible with the transfer pad printing method. Transfer pad printing, in general, prefers a moderately viscous material. This preference can be easily accommodated with the formulaic modification delineated above as the "viscosity modification." The viscosity of the composition can indirectly influence drying parameters, such as drying time, air flow and temperature requirements. Therefore, transfer pad printed products may require longer drying times, if the percentage of the gelling agent in the overall composition is not manipulated. Manipulating the air flow, humidity and temperature within the drying environment, is preferable for production operations because it allows for the formula to remain within the material tolerances of the chemical components. The air flow, humidity and the drying temperatures can be adjusted to maximize drying time, but, as it is known to those competent in the relevant arts, severe alterations of these parameters can be detrimental to the product.

iii. Pen Plotter Printing:

A printing method that is suitable for prototype and small quantity production is Pen Plotter Printing. A pen plotter, fitted with a special pen-tip design to be compatible with the present electrically conductive polymeric composition, is capable of rapid design, re-design and manufacturing of prototype circuit boards. The pen plotter is similar to a standard computer printer. The plotter is connected to the computer and the pen-tips are filled with the electrically conductive polymeric composition. The computer image of the circuit can then be printed directly onto the substrate. Pen plotters use linear-drives to position the pen-tips over the substrate. Like a normal computer printer, the pen plotter usually prints on two-dimensional substrates. However, pen plotters capable of printing in three dimensions are available.

The pen plotter printing method is advantageous because it does not require templates or other intermediate steps. It is also adept at prototype circuit designing and printing because it is directly linked to the computer. However, pen plotting cannot print at high speeds relative to other printing methods. Therefore, it is limited as a high-volume production method.

The disclosed aqueous electrically conductive and electrically insulative polymeric compositions are compatible with the pen plotter printing method. Pen plotter printing, in general, prefers a material with low viscosity. This preference can be easily accommodated with the formulaic modification delineated above as the "viscosity modification." However, manipulating the air flow, humidity and temperature within the drying environment, is preferable for production operations because it allows for the formula to remain within the material tolerances of the chemical components.

iv. Ink Jet Printing:

Ink jet printing, like pen plotter printing above, is ideal for producing prototype circuits in test quantities. It forms such a circuit on the substrate by electrically controlling an array of numerous small spray valves which open and close, controlling a fine spray of the electrically conductive polymeric composition. Some of the jet spray is diverted away from the substrate, so that the droplets that do reach the substrate form the precise pattern of the circuit. The array of spray valves or ink jets is controlled by a linear driver, which is controlled by the computer. Therefore, the precision and quality of the printed circuit is a function of the acumen of the computer. Ink jet printing is similar to pen plotter printing and to standard computer printing, in the fact that there is no need for transparencies or templates. The circuit can be immediately printed and tested from the computer. These abilities promote ink jet printing as a viable form of circuit production on the scale of prototypes and small quantities. However, ink jet printing is usually limited to two-dimensional printing on thin substrates, such as paper, sheets of plastics and metal foils. In addition, most, but not all, ink jet printers induce an electrostatic charge in the ink, aiding adhesion. This process is incompatible with the electrically conductive properties of the present polymeric invention, and would thus need to be obviated. However, there are some ink jet systems that are not electrostatic. However, the electrically insulative formula of the present invention can be employed with this electrostatic process.

The disclosed aqueous electrically conductive and electrically insulative polymeric compositions are compatible with the ink jet printing method. Ink jet printing, in general, prefers a material with low viscosity. This preference can be easily accommodated with the formulaic modification delineated above as the "viscosity modification." Therefore, the printing methods that prefer materials with lower viscosity, like pen plotter printing, will require shorter drying times, which is advantageous for prototype circuit printing.

v. Masked Printing:

A circuit can also be printed utilizing masking techniques. The substrate is simply masked, or covered, in the areas where the electrically conductive polymeric composition is not desired. The composition is then applied by any number of techniques, such as dipping, spraying or using rollers. The masking is removed to expose the desired circuit pattern. This printing technique is adept with larger, simpler circuit designs, rather than minute, complex patterns. However, masked printing is highly adaptable. The mask may be as simple as stamp cut adhesive paper or etched metal; or, as complex as a photo-resistive polymer that can be cured using ultraviolet (UV) light. Masked printing is highly suitable for structural integrity sensor matrices described below. Using the masked printing method, the disclosed electrically conductive polymeric composition can be applied to structures, such as bridges and buildings, to detect cracks in the infrastructure.

The masking technique best suited for a process is dictated by the final product specifications and allowable tolerances. For example, a paper mask is simple and cheap, but it may not be capable of providing the necessary precision for the circuit pattern. The same is also true for the technique of applying the electrically conductive polymeric composition through a dipping process. Spraying is better suited for intricate patterns and delicate substrates. Dipping techniques work well with three-dimensional substrates and for EMI shielding. Moreover, depending upon the method employed, masked printing may create substantial waste by using excess material, which increases production costs.

The disclosed aqueous electrically conductive and electrically insulative polymeric compositions are compatible with the masked printing method. Masked printing, in general, prefers a material with low viscosity. This preference can be easily accommodated with the formulaic modification delineated above as the "viscosity modification." The viscosity can influence drying parameters, such as drying time, air flow and temperature requirements. Therefore, the printing methods that prefer materials with lower viscosity, like masked printing, will require shorter drying times, which is advantageous for mass production.

vi. Waterless Lithography:

Waterless lithography utilizes three main components: the waterless plate, the disclosed electrically conductive polymeric composition and the printing press equipment. The "waterless plate" is based on a lamination design. Common metals, usually aluminum, are used as the base material. A light sensitive photopolymer is bonded to the aluminum. Then, a micron thick coating of silicone rubber is applied atop the photopolymer.

The plate is then exposed to UV light, controlled by a film carrier, which passes through the silicon layer and strikes the photopolymer beneath. The UV exposure activates the photopolymer, breaking the bond between the photopolymer and the silicon. The photoreaction is extremely precise; easily achieving resolution as fine as six micro-lines, supporting a dot range from 0.5% to 99.5% at 175 lines per inch. This magnitude of accuracy enables waterless lithography to print the most minute and intricate circuit boards relative to all other printing processes.

After UV exposure, the plate is treated to remove the silicone from the image area, leaving the photopolymer layer. The photopolymer layer is receptive to the electrically conductive polymeric composition, which allows the plate to selectively attract and resist the material. The plate can then be used to transfer the electrically conductive polymeric composition to the intended substrate in the precise circuit pattern. Waterless lithography utilizes a plate cylinder or a flat plate to apply the circuit design to the substrate. Both printing techniques are best suited for two-dimensional surfaces. However, flexible substrates, such as plastic films, clothe and foils can be used with the plate cylinder technique; while the flat plate is best suited for rigid, static substrates like glass, thick plastic and thick metal. Waterless lithography is capable of high-quality, high-volume production of the most complex circuit applications of the disclosed electrically conductive polymeric composition.

The disclosed aqueous electrically conductive polymeric composition is compatible with the waterless lithography. Waterless lithography, in general, prefers a more viscous, gel-like material. This preference can be easily accommodated with the formulaic modification delineated above as the "viscosity modification." However, the optimum drying conditions can be achieved by controlling the drying environment, rather than the formula. Manipulating the air flow, humidity and temperature within the drying environment is preferable for production operations because it allows for the formula to remain within the material tolerances of the chemical components.

vii. Flexographic Printing:

The disclosed electrically conductive polymer composition can be printed with the flexographic printing method. It is a variation on letterpress printing, using flexible set type or printing plates. The disclosed electrically conductive polymer composition is deposited onto the raised type surface, which holds the circuit pattern; then, the type and the substrate are pressed together in order to transfer the pattern of the circuit to the substrate. Provided that the type, substrate and ink are all compatible, almost any circuit pattern can be printed using the flexographic printing method.

Flexographic printing is commonly used in manufacturing packaging and labels; therefore, flexographic printing can incorporate the disclosed electrically conductive polymer composition into packaging and label products as well as other applications. There is a considerable market for packaging and labeling that incorporates an electrical circuit; for example, food and beverage products, pharmaceuticals, medical supplies and novelties. Flexographic printing is compatible with high-volume, low-cost production of all these packaging and labeling products. A disadvantage of flexographic printing is its printing accuracy tolerance. Flexographic printing is inherently less accurate because of its flexible nature. Therefore, the most complex circuits should be printed using a more precise printing method. However, flexographic printing is adept with low-cost, medium-quality mass production.

The disclosed aqueous electrically conductive polymeric composition is compatible with the flexographic printing. Flexographic printing, in general, prefers a more viscous, gel-like material. This preference can be easily accommodated with the formulaic modification delineated above as the "viscosity modification." The viscosity can indirectly influence drying parameters, such as drying time, air flow and temperature requirements. However, the optimum drying conditions can be achieved by controlling the drying environment, rather than the formula. Manipulating the air flow, humidity and temperature within the drying environment is preferable for production operations because it allows for the formula to remain within the material tolerances of the chemical components.

G. EMI Shielding:

Electro-Magnetic Interference (EMI) in the Radio Frequency (RF) spectrum, from the environment or from internal sources, such as high-speed circuits, can disrupt numerous electronics. Traditional methods of EMI shielding can be impractical or disadvantageous. The disclosed invention is a viable alternative for EMI shielding because of its water-based electrically conductive polymeric nature. In order for the novel aqueous electrically conductive polymeric composition to be implemented as a form of EMI shielding, it must be laid out in a continuous film. Spraying or dipping the part can easily produce this continuous film of the present invention. The polymeric composition can be used to coat the inside paneling of the housing for the electronics, effectively shielding everything within the housing. It can also be sprayed directly over the components or equipment intended to be shielded. Entire circuit boards can be coated. First, a pretreatment of a thin layer of the electrically insulative polymer composition should be deposited onto the circuit board substrate. After the electrically insulative layer has cured, the electrically conductive layer can be applied in the circuit pattern. In addition, if the application warrants, multiple layers of the electrically conductive polymeric composition can be applied with interposing electrically insulative layers. As a corollary, the electrically insulative formulaic material can be topically applied to provide durability and scratch resistance to the surface of the part.

The present invention can also provide EMI shielding for data cabling a well as circuitry. The traditional method for manufacturing EMI shielded cables is time consuming and costly. A simple dipping or spraying process can be used to coat most types of cable with the present electrically conductive polymeric composition. In the dipping process, the thickness of the shielding-layer can be varied by adjusting the viscosity of the material and the speed at which the cable is removed from the bath. The electrically conductive polymeric composition can be sprayed on to the cabling for applications in which only a small quantity of coated cable is needed. Likewise, spraying the cabling with the polymeric composition is effective for intermittent EMI shielding.

H. Electrical Contacts:

The disclosed aqueous electrically conductive polymer composition is extremely resistant to oxidation and other forms of corrosion. It is excellent as a thermal and electrical conductor. The combination of these properties makes the present invention a preferred material for electrical contacts. It is capable of maintaining electrical contact in harsh chemical, thermal, mechanical and electromagnetic conditions. The combination of wetting agents, dispersants and antifoaming agents allows the electrically conductive material to be completely enveloped by a thin polymer layer. This polymer layer is thick enough to protect the electrically conductive material, which can often be highly susceptible to oxidation, yet is thin enough to allow for satisfactory electrical conduction.

Using the present aqueous electrically conductive polymer composition as an electrical contact material is substantially more cost effective than gold plating, which is the industry standard. However, it has a lower abrasion resistance than gold plating, so attention and care should be taken when implementing the present aqueous electrically conductive polymer composition as an electrical contact.

I. Electronic Component Placement:

It is within the scope and spirit of the present invention to use the aqueous electrically conductive polymer composition as a material means for attaching electrical components, such as computer chips, to the circuit board. The viscosity of the material can be increased by implementing the formulaic modifications enumerated within the "viscosity modifications" section. The increased viscosity will aid in making the material more gelatinous, which allows for better component placement. The aqueous electrically conductive polymer composition can be applied as both the electrical circuit and as the gel-pad for the component. The aqueous electrically conductive polymer composition can be applied to the substrate in globules at the precise positions of the feet of the component. The component can then be placed in the uncured material. As a corollary, the electrically insulative polymer composition can be applied topically to keep the component in place and to add to the structural integrity. In addition, a globule of the electrically insulative material can be placed under the component in areas where the electrically conductive pads do not extend in order to augment the adhesion of the electronic component to the substrate.

J. Structural Integrity Matrices:

The disclosed invention was designed specifically to be a low-cost, multifunctional, water-based electrically conductive polymer to be utilized by the electronics industry and its peripheries. One such periphery is structural integrity matrices employed to monitor the mechanical stress incurred by structures such as bridges, tunnels, dams and tall buildings. It is imperative to monitor the structural integrity of these structures in order to anticipate the need for repair and avoid catastrophic events. The present invention can also be used as an alarm circuit for monitoring the security of a structure. The disclosed electrically conductive polymeric composition can be applied to existing structures as well as to those in the construction process. The most suitable application process is to mask-spray grids or matrices onto the infrastructure and stress-bearing points of the structure. These matrices should be complete circuits connected to a monitoring system. The local monitoring system can then be integrated into a central processing unit that can alert engineers and repair crews when a circuit is broken. It will also be necessary to protect the layer of the electrically conductive polymeric composition with another layer of the electrically insulative polymeric composition. The electrically insulative layer will protect the electrically conductive layer from environmental stress. Since the formulas for the two layers are fundamentally similar, the two layers will behave similarly during operation. Therefore, the combination of these two layers will not inhibit the ability of the monitoring system.

There are some modifications and system developments, within the scope and spirit of the invention that can enhance the structural integrity monitor application. One such modification is to spray the structural substrate on the micro-level, rather than on the macro-level, incorporating the disclosed electrically conductive polymeric composition into the fabrication of the construction materials, so that it will not be necessary to implement its application after construction. This modification is possible by implementing a matrix format design that can integrate and maintain electrical contact between all the sensor circuits.

K Lighting:

The present aqueous electrically conductive polymeric composition can be integrated into the electrical circuitry of several light emission devices, such as headlights and taillights for automotive technologies, for example. The principle advantage of utilizing the disclosed invention in lighting technologies is twofold: lower production costs and higher efficiency for components. For example, the disclosed invention can be used conjointly with Light Emitting Diodes (LEDs) to replace inefficient incandescent lamps, for lower production costs for circuitry and more efficient lighting systems. The present invention can be incorporated into the circuitry of flexible LED arrays, which can allow for superior alignment and positioning of the LED array for increased brightness of headlights and taillights. The disclosed electrically conductive polymeric composition can also be embodied in security or ground lighting, electronics displays, flashlights and traffic lights. Since the electrically conductive parameters of the disclosed invention can be accurately controlled in production, it is possible to incorporate LED's, or other light emitting technologies, directly into the electrically conductive material. This material ability allows for lighting systems with fewer components, which alleviates production costs assembly time.

L. Quality Control Sensors/Time or Information Control Sensors:

It is within the spirit and scope of the disclosed aqueous electrically conductive polymeric composition to embody circuitry that can be utilized as a mechanism for Quality Control (QC) and Information Control (IC). The design for such a mechanism can be a simple circuit. For example, the packaging for a food or beverage product has a simple continuous circuit printed on the surface at strategic points of contact. The packaging also contains a small and inexpensive battery or capacitor inline with the circuit. Thus, when the circuit is broken by tampering or by the costumer, a QC alarm is activated. This alarm can take on numerous forms, from a blinking light to a vibrator to a siren. This simple QC mechanism can be elaborated and modified.

One such modification would be to create an information control mechanism. An IC circuit can store and regulate information based on the same principles as the QC circuit. For example, a pharmaceuticals dispenser is fabricated with the disclosed electrically conductive polymeric composition printed as an array of continuous circuits in parallel. This circuit array overlays the perforated, or otherwise designated, exit portals for the pharmaceutical capsules. Again, an inexpensive battery or capacitor is inline with the circuit. There is also a Processing Chip (PC) inlaid with the circuit. Thus, when a single capsule is removed from the dispenser, the PC records the time of dispensation. This can be useful to record the time throughout the period of medication. However, the PC can also be programmed to begin a dispensation cycle initiated by dispensing the first dosage. The PC can be programmed to set off an alarm, not unlike the QC alarm mentioned above, at programmed intervals, to remind the patient of dispensation.

M. Antennae:

It is within the spirit and scope of the disclosed aqueous electrically conductive polymeric composition to embody antennae that can be utilized to transmit and receive EMF signals. The design for such a mechanism can be a printed line connected to a simple circuit, both made from the present aqueous electrically conductive polymeric composition. An array of antennae of varying lengths can be designed so that EMF signals of varying wavelength can be transmitted and received. This embodiment of the present aqueous electrically conductive polymeric composition can be printed directly on to the shell of the desired electronics device, such as a cellular phone, computer module, car alarm remote, headphones, buildings, etc. Printing the antenna and electrical circuit directly onto the substrate or shell of the electronic device eliminates a whole set of electronics components. Rather than printing the circuit board on an additional component, which compounds materials and assembly costs, printing the circuit board directly onto the material that inherently forms the product itself diminishes production and assembly costs.

N. Fuel Cell Sealants:

It is within the spirit and scope of the disclosed electrically conductive water-based polymeric composition to embody sealants to be utilized in electrochemical fuel cells. Electrochemical fuel cells—in particular, PEM fuel cells—comprise a plurality of components that must be sufficiently integrated, amalgamated into a fuel cell assembly that is fluid-impermeable, i.e., leak-free. Typically, prior art PEM fuel cells incorporate planar components—or components with major planar surfaces—such as the bipolar separators and the Membrane Electrode Assembly (MEA) that require sealing in order to prevent leaks between the component surfaces. The disclosed invention is extremely well suited for such employment due to its combination of sealing and electrically conductive properties. The electrically conductive water-based polymeric material can be modified by means of the descriptions of modifications enumerated above so that the material properties, such as viscosity, electrical and thermal conductivity, adhesion, etc., are within the optimal parameters of the fuel cell application such as sealing the perimeter of the fuel cell. The electrically conductive water-based polymeric material can be applied to the perimeter of the fuel cell bipolar separator or bipolar separator-MEA interface. Due to the disclosed invention's chemical properties, the material can also be applied dry, tape-like along the perimeter.

It should be noted that the examples illustrated above are representative and only intended to elucidate the spirit and scope of the disclosed electrically conductive water-based polymeric composition, rather than encompass the exhausted totality of possible embodiments.

Having thus disclosed our invention, we claim as novel and request to secure by Letters Patent:

1. An aqueous polymeric emulsion composition, comprising:
   a. approximately 50 to 91% of total compositional weight of a water-soluble acrylic polymer copolymerized with another polymer selected from the group consisting of styrene polymers, acrylate polymers, polyacrylate polymers, (meth)acrylate polymers, poly(meth)acrylate polymers, hydroxyl polymers; esters and acids of acrylic polymers, styrene polymers, acrylate polymers, polyacrylate polymers, (meth)acrylate polymers, poly (meth)acrylate polymers, hydroxyl polymers and further polymerizations thereof;
   b. an effective amount of a water-soluble wetting agent;
   c. a water-soluble ductility agent;
   d. a solvency effective amount of water;
   e. wherein said composition is electrically insulative.

2. The aqueous polymeric emulsion composition of claim 1, wherein said water-soluble wetting agent comprises approximately 1 to 33% of total compositional weight, and is selected from the group consisting of methyl diglycol, butyl diglycol ether, propylene glycol methyl ether, dipropylene glycol methyl ether, ethylene glycol n-butyl ether and diethylene glycol n-butyl ether.

3. The aqueous polymeric emulsion composition of claim 1, wherein said water-soluble ductility agent comprises approximately 0.1 to 8% of total compositional weight, and is selected from the group consisting of dibutyl phthalate and butyl phthalate.

4. The aqueous polymeric emulsion composition of claim 1, wherein said composition is augmented with a water-soluble surfactant, which comprises approximately 0.1 to 7% of total compositional weight, and is selected from the group consisting of acrylate polymers, ethyl polymers, cross-linked acrylate-ethyl polymers, cross-linked acrylate-ethylhexyl polymers, hydroxy propyl methyl cellulose and hydroxy ethyl methyl cellulose.

5. The aqueous polymeric emulsion composition of claim 1, wherein said composition is augmented with a fluoropolymer, such as polytetrafluoroethylene and perfluorosulfonic acid ionomer, comprising approximately 0.1 to 19% of total compositional weight.

6. The aqueous polymeric emulsion composition of claim 1, wherein said solvent amount of water is manipulated by percentage of total weight of said composition in order to vary the material viscosity properties and/or curing properties of said composition.

7. The aqueous emulsion composition of claim 1, utilized to protect conductive substrates from corrosion.

8. The aqueous emulsion composition of claim 1, utilized to protect insulative substrates from corrosion.

9. The aqueous polymeric emulsion composition of claim 1, utilized to produce, operate and maintain electrically insulated electrical circuitry, electrical circuit boards or other physical means for transmitting electricity.

10. The aqueous polymeric emulsion composition of claim 1, utilized to produce, operate and maintain electrical circuitry embodied within multiple collocated layers separated and insulated from each other by said composition, such that electrical contact between circuit layers occurs only where desired.

11. The aqueous polymeric emulsion composition of claim 1, utilized as a sealant.

12. The aqueous polymeric emulsion composition of claim 1, utilized as an electrically insulative sealant specifically to produce, operate and maintain electrochemical fuel cells or electrolysis cells.

13. The aqueous polymeric emulsion composition of claim 1, utilized as an electrically insulative adhesive for mounting and fastening electronic components.

* * * * *